US008516905B2

(12) United States Patent
Nakamura et al.

(10) Patent No.: US 8,516,905 B2
(45) Date of Patent: Aug. 27, 2013

(54) MEMS PRESSURE SENSOR

(75) Inventors: Kunihiko Nakamura, Osaka (JP);
Tomohiro Iwasaki, Shiga (JP);
Takehiko Yamakawa, Osaka (JP); **Keiji
Onishi**, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/583,379

(22) PCT Filed: Apr. 2, 2012

(86) PCT No.: PCT/JP2012/002297
§ 371 (c)(1),
(2), (4) Date: Sep. 7, 2012

(87) PCT Pub. No.: WO2012/140846
PCT Pub. Date: Oct. 18, 2012

(65) Prior Publication Data
US 2013/0047746 A1 Feb. 28, 2013

(51) Int. Cl.
*G01L 1/10* (2006.01)
*G01B 7/16* (2006.01)
(52) U.S. Cl.
USPC .......................... 73/862.59; 73/777
(58) Field of Classification Search
USPC ............................. 73/777, 862.59
See application file for complete search history.

(56) References Cited

U.S. PATENT DOCUMENTS

| 5,747,705 | A | 5/1998 | Herb et al. |
| 6,628,177 | B2 * | 9/2003 | Clark et al. .................. 333/186 |
| 7,334,481 | B2 | 2/2008 | Correale |
| 7,456,042 | B2 * | 11/2008 | Stark et al. .................... 438/50 |
| 7,692,358 | B2 | 4/2010 | Kvisteroy et al. |
| 8,026,120 | B2 * | 9/2011 | Kihara et al. .................. 438/50 |
| 8,269,291 | B2 * | 9/2012 | Buchwalter et al. .......... 257/419 |
| 2006/0266124 | A1 | 11/2006 | Correale |
| 2008/0224568 | A1 | 9/2008 | Kvisteroy et al. |

FOREIGN PATENT DOCUMENTS

| JP | 63-63739 | 4/1988 |
| JP | 7-504980 | 6/1995 |
| JP | 2001-507801 | 6/2001 |
| JP | 2005-37309 | 2/2005 |
| JP | 2006-322935 | 11/2006 |
| JP | 2008-164592 | 7/2008 |
| WO | 93/18381 | 9/1993 |

OTHER PUBLICATIONS

International Search Report issued May 15, 2012 in International (PCT) Application No. PCT/JP2012/002297.

* cited by examiner

*Primary Examiner* — Max Noori
(74) *Attorney, Agent, or Firm* — Wenderoth, Lind & Ponack, L.L.P.

(57) ABSTRACT

A MEMS resonator 100 including a substrate 112; an vibrator 102 including an mechanically vibrating part and a fixed part; at least one electrode 108 that is close to the vibrator and has an area overlapping with the vibrator across a gap 109 in a direction perpendicular to a surface of the substrate; and a pressure transferring mechanism to displace the at least one electrode according to an externally applied pressure so as to change the gap; is connected to a detection circuit that detects transmission characteristics of an AC signal from an input electrode to an output electrode, the input and output electrodes being one and the other of the vibrator 102 and the at least one electrode 108, and the pressure is detected based on the transmission characteristics of the AC signal that is detected by the detection circuit.

9 Claims, 9 Drawing Sheets

(a)

(b)

(a)

(b)

(a)

(b)

(a)

(b)

(a)

(b)

(a)

(b)

(a)

(b)

MEMS PRESSURE SENSOR

TECHNICAL FIELD

The present invention relates to a resonator, in particular to microelectromechanical systems (MEMS), and a pressure sensor using a resonator in which a micromechanical component vibrates.

BACKGROUND ART

Conventional pressure sensors using MEMS resonators will be described with reference to FIG. 7.

FIG. 7(a) is a cross sectional view of a pressure sensor disclosed in Patent Literature 1. An vibrator 3, a sacrifice layer 10 and a shell 4 are formed on a silicon substrate by a thin film process, the sacrifice layer is removed by etching, and then an etching fluid-introducing hole in the shell is closed to form a vacuum chamber around the vibrator. Subsequently, the substrate is etched from the backside to make it thinner, and a diaphragm is thus formed.

If pressure is applied to the diaphragm from the backside of the substrate, the diaphragm bends and the vibrator is stressed. If the vibrator is a fixed-fixed beam with both ends being fixed, the axial stress of the beam changes in its longitudinal direction and the resonance frequency of the vibrator changes according to this axial stress. Since the vibrator and shell has a capacitance between them, excitation of the vibrator and detection of the frequency change are electrically operated. As a result, the change of the axial stress can be measured based on the change of the resonance frequency of the vibrator, and a force given to the diaphragm, i.e. the pressure, can be measured based on the change of the axial stress.

In manufacturing the pressure sensor of Patent Literature 1, the vibrator, vacuum chamber and shell are formed on the front side of the silicon substrate, and then it is required to overlay an etching mask on the backside of the silicon substrate and perform etching while protecting the front side in order to form the diaphragm. It is therefore difficult to control the thickness of the diaphragm with high accuracy, if the diaphragm is designed to be extremely thin and the desired thickness is by far thinner than the thickness of the substrate.

FIG. 7(b) shows a cross sectional view of a pressure sensor disclosed in Patent Literature 2. A vacuum chamber is formed around an vibrator 14 by a thin film. The difference from the pressure sensor of Patent Literature 1 is that a structure 13 with the outermost surface of a polysilicon layer 11 functions as a diaphragm. This pressure sensor measures pressure by converting pressure that is applied on the surface of the diaphragm 13 to a stress of the vibrator 14, electrically detecting the change of the resonance frequency of the vibrator 14, and converting the detected electrical signal to the pressure. The sensitivity to pressure depends on the rigidity of the diaphragm, i.e. the thickness of the polysilicon layer. Since the diaphragm is not formed by etching the substrate, the thickness of the diaphragm is easier to control in the pressure sensor disclosed in Patent Literature 2 than of Patent Literature 1.

RELATED ART LITERATURE

Patent Literature
Patent Literature 1 JP-A-2005-37309
Patent Literature 2 JP-T-2001-507801

SUMMARY OF THE INVENTION

Problem to be Solved by the Invention

However, it was difficult to detect pressure with high accuracy by those conventional pressure sensors using a MEMS resonator. An object of the present invention is to provide a pressure sensor using a MEMS resonator that can detect pressure change at high resolution.

Solution to Problem

An embodiment of the present invention is directed to a MEMS pressure sensor including:
a MEMS resonator including:
a substrate;
a vibrator including a mechanically vibrating part and a fixed part;
at least one electrode that is disposed close to the vibrator and has an area overlapping with the vibrator across a gap in a direction perpendicular to a surface of the substrate; and
a pressure transferring mechanism to displace the at least one electrode according to externally applied pressure so as to change the gap; and
a detection circuit to detect transmission characteristics of an AC signal from an input electrode to an output electrode, the input and output electrodes being one and the other of the vibrator and the at least one electrode,
wherein the pressure is detected based on the transmission characteristics of the AC signal that is detected by the detection circuit.

Advantageous Effects of the Invention

In the pressure sensor of the above embodiment, external pressure displaces an element (i.e. electrode) that has a capacitance between it and the vibrator, the change of the resonance frequency of the vibrator is electrically detected, the change being caused by the change of the electric field intensity arising from the displacement, and the pressure is detected based on the detected change. According to the above embodiment, since the resonance characteristics having a high Q factor is utilized, a MEMS pressure sensor that detects pressure at high resolution is achieved.

BRIEF DESCRIPTION OF DRAWINGS

FIG. 1 shows a MEMS pressure sensor structure according to a first embodiment of the present invention, in which FIG. 1(a) is a cross sectional view, and FIG. 1(b) is a top view without a shell structure.

FIG. 2 shows a method of detecting a resonance frequency change, in which FIG. 2(a) is schematic view showing a detection method by oscillation, and FIG. 2(b) is a schematic view showing a detection method by monitoring a resonator output at a fixed frequency.

FIG. 3 is a schematic view that describes an anchor structure and Q factor deterioration, in which FIG. 3(a) is a perspective view that describes an underetched shape of a vibrator anchor, and FIG. 3(b) is a sectional view showing a pressure sensor structure in which the underetched shape is eliminated.

FIG. 4 shows a MEMS pressure sensor structure according to the second embodiment of the present invention, in which FIG. 4(a) is a cross sectional view, FIG. 4(b) is a sectional view taken along a longitudinal direction of an vibrator, and FIG. 4(c) is a top view in which a diaphragm is removed.

FIG. 5 is operation explanatory views of the MEMS pressure sensor according to a second embodiment of the present invention, in which FIG. 5(a) is a graph showing a relation between the external pressure and the gap displacement, and FIG. 5(b) is a graph showing a relation between the gap displacement and the change in resonance frequency.

FIG. 7 is a schematic view that describes a conventional MEMS pressure sensor, in which FIG. 7(a) is a cross sectional view of a MEMS pressure sensor having such a structure that a vibrator contained in a shell and the shell have a capacitance between them, and a resonance-frequency change of the vibrator is caused by pressure on a lower-side diaphragm and the resonance-frequency change is detected, and FIG. 7(b) is a cross sectional view showing a pressure sensor having such a structure that a shell also functions as a diaphragm.

FIG. 8 is a schematic view that describes a significance of Q factor on the detection of pressure by a MEMS pressure sensor, in which FIG. 8(a) is a schematic view at a high Q factor of the resonance, and FIG. 8(b) is a schematic view at a low Q factor of the resonance.

FIG. 9 is a schematic view that describes an influence of the structure of a MEMS pressure sensor on Q factor of the resonance, in which FIG. 9(a) is a cross sectional view showing a pressure sensor in which the anchors of a vibrator are fixed on a substrate having a high rigidity, and FIG. 9(b) is a cross sectional view showing a pressure sensor in which the anchors of a vibrator are fixed on a diaphragm having a low rigidity.

FIG. 10 shows a MEMS pressure sensor structure of a variation of the second embodiment of the present invention, in which FIG. 10(a) is a cross sectional view, FIG. 10(b) is a sectional view taken along a longitudinal direction of a vibrator, and FIG. 10(c) is a top view in which a diaphragm is removed.

DESCRIPTION OF EMBODIMENTS

Firstly, the details about how the present invention has been accomplished will be descried below.

Figure 8:
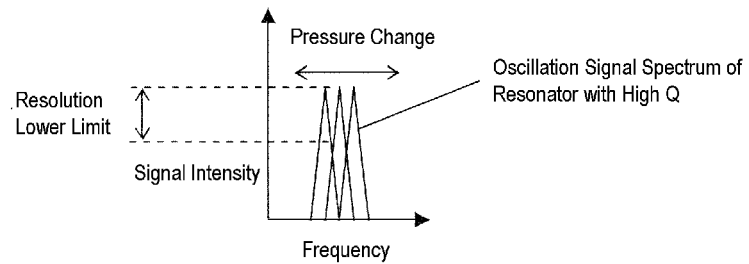
Figure 8:
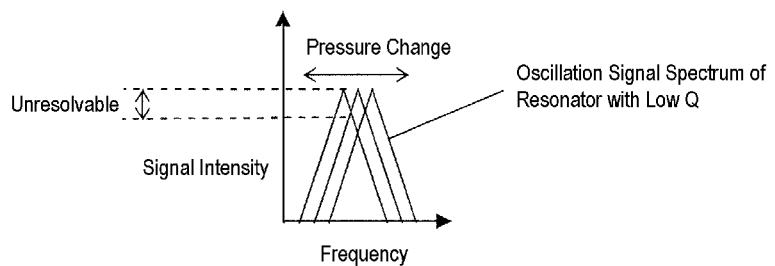

Q factor is an indicator of resonator performance. Q factor shows the sharpness of resonance, and a higher Q factor means a lower energy loss of vibration energy of resonance. Oscillation of a resonator having a high Q factor gives a steeper oscillation spectrum as shown in FIG. 8(a). The word "steep" means that noise level is comparatively low at the frequencies around the center frequency of oscillation. If a resonator having a high Q factor is used as a pressure sensor, it has a high resolution for frequency changes that are caused when oscillation frequency changes by pressure changes. Given that the frequency change between two adjacent spectrums in FIG. 8(a) is the lower limit that can be resolved by an electric circuit, the equivalent pressure change cannot be resolved in the oscillation by use of a resonator having a low Q factor as shown in FIG. 8(b) because of its bad S/N. This is why resonators having a high Q factor are desirable.

Figure 9:
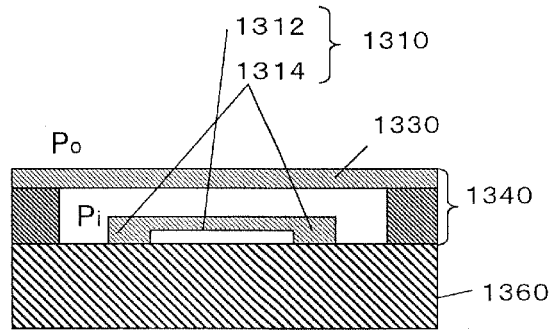
Figure 9:
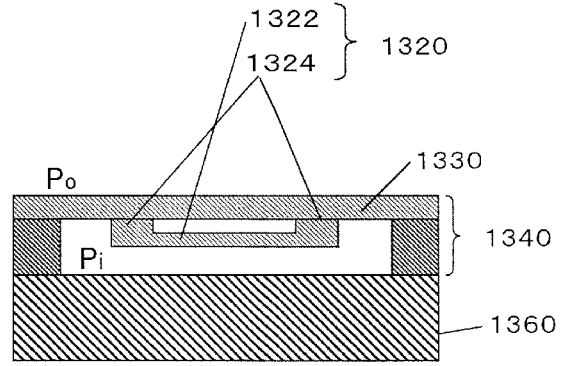

However, when vibrator supporters 1324 are fixed on a diaphragm 1330 that is part of a shell structure 1340 as shown in FIG. 9(b), the diaphragm 1330 also vibrates slightly along with the vibration of a vibrating part 1322 of the vibrator due to the structural weakness of the diaphragm 1330, which deteriorates the Q factor of the vibrator 1322. Therefore, when vibrator supporters 1314 are fixed on a rigid substrate 1360 as shown in FIG. 9(a), a diaphragm 1330 vibrates less even when a vibrating part 1322 of the vibrator vibrates. As a result, the Q factor reaches high due to lower energy loss. However, if the vibrator 1310 is fixed as above, deformation of the diaphragm 1330 by pressure is hardly transferred to the vibrator as its axial stress, and thus does not change the resonance frequency of the vibrator 1310.

In order to solve the problem, the present inventors have performed various experiments. As a result, they focused on the principle that a change of a gap between a vibrator and electrode changes the electric field intensity between them, and thereby the resonance frequency of the vibrator is changed, instead of the principle that deformation of a diaphragm by pressure changes the resonance frequency through the change of the stress of the vibrator. As a result, they have found that the structure wherein the electrode is displaced to change the gap between the vibrator and electrode realizes a MEMS pressure sensor that can detect pressure with high accuracy A MEMS pressure sensor according to a first embodiment of the present invention, includes:
a MEMS resonator including:
a substrate;
a vibrator including a mechanically vibrating part and a fixed part;
at least one electrode that is disposed close to the vibrator, and has an area overlapping with the vibrator across a gap in a direction perpendicular to a surface of the substrate; and
a pressure transferring mechanism to displace the at least one electrode so as to change the gap according to externally applied pressure; and
a detection circuit to detect transmission characteristics of an AC signal from an input electrode to an output electrode, the input and output electrodes being one and the other of the vibrator and the at least one electrode,
wherein the pressure is detected based on the transmission characteristics of the AC signal that is detected by the detection circuit.

The MEMS pressure sensor of the above structure detects pressure on the basis of the principle that when external pressure displaces the electrode that has a capacitance between it and the vibrator and the displacement changes the gap, the transmission characteristics of the AC signal between the vibrator and electrode is changed. Such pressure detecting mechanism is not found in conventional MEMS pressure sensors. According to this mechanism, it is not required to stress the vibrator according to change of the external pressure. It is therefore possible to utilize a resonance having a high Q factor, and a MEMS pressure sensor that can detect pressure at high resolution is thus achieved.

For example, the above MEMS pressure sensor is constructed such that:
the MEMS resonator further includes a diaphragm that displaces according to externally-applied pressure,
the pressure transferring mechanism is composed of the diaphragm, and
at least part of the diaphragm is formed by the electrode.

According to this structure, the MEMS pressure sensor has a simple structure and its production process can be simplified Alternatively, the above MEMS pressure sensor is constructed, for example, such that:
the MEMS resonator includes a diaphragm that displaces according to externally-applied pressure, and
the pressure transferring mechanism is composed of the diaphragm and at least one connector that connects the diaphragm with the at least one electrode.

According to this structure, the MEMS pressure sensor is compatible with not only the vibrator of the vibration mode perpendicular to the surface of the substrate, but also the vibrators of the other modes that have a high Q factor such as vibration mode parallel to the surface of the substrate or torsional vibration mode.

Alternatively, the above MEMS pressure sensor is obtained by being constructed, for example, such that:

the MEMS resonator includes a diaphragm that displaces by externally-applied pressure, the vibrator and the at least one electrode are disposed between the diaphragm and the substrate, a first cavity and a second cavity are formed between the substrate and the diaphragm, the first and second cavities being separated by the at least one electrode, the first cavity is located at a side of the vibrator in a direction perpendicular to the surface of the substrate when viewed from the at least one electrode at the area where the vibrator and the electrode overlap with each other, the second cavity is located at an opposite side of the vibrator in a direction perpendicular to the surface of the substrate when viewed from the at least one electrode at the area where the vibrator and the electrode overlap with each other, an inner surface of a barrier wall A is located at an outer side than an inner surface of a barrier wall B in a direction parallel to the surface of the substrate, the barrier wall A defining the first cavity and being in contact with the electrode, the barrier wall B defining the second cavity and being contact with the electrode, and the pressure transferring mechanism is composed of the diaphragm, barrier wall A and barrier wall B.

With such a structure, it is possible to achieve a MEMS pressure sensor with a simple structure, of which production process can be simple.

In the above MEMS pressure sensor, if the MEMS resonator has any of the above structures, it is preferable that the fixed part of the vibrator is fixed on the substrate. For example, the fixed part of the vibrator may be fixed by a barrier wall that is fixed on the substrate and surrounds a space that allows the vibrator to vibrates mechanically. According to this structure, since the substrate hardly displaces by an external pressure, the vibration of the vibrator is hardly changed by the other factors than the change of the gap. The MEMS sensor that detects pressure at high resolution with a high Q factor is thus achieved.

Also, the above MEMS pressure sensor may be one wherein:

the vibrator is a beam structure in which the vibrating part of the vibrator is a beam that is provided parallel to the surface of the substrate between the fixed parts of the vibrator, the beam has a triangular or trapezoidal cross section of which base is parallel to the surface of the substrate, and the beam vibrates mechanically in a torsional resonance mode with its center being a longitudinal axis of the beam.

According to this structure, the MEMS pressure sensor that detects pressure at high resolution with a high Q factor is achieved.

Also, the detection circuit of the MEMS pressure sensor may include, for example, a feedback circuit with an amplifier along a path, a signal of the feedback circuit is partially sent to a frequency-voltage converting circuit, and the detection circuit detects an oscillation frequency of the vibrator as the transmission characteristics of the AC signal by vibrating the vibrator at a predetermined vibration mode while applying a DC potential between the input and output electrodes and outputs pressure information as an electrical signal by converting a change of the oscillation frequency to a voltage change by the frequency-voltage converting circuit, in which the change of the oscillation frequency is caused by a change of a resonance frequency of the vibrator that occurs when the gap changes according to the externally-applied pressure. According to this detection circuit, the change of the resonance frequency according to the pressure is output as the electrical signal.

Alternatively, the detection circuit of the MEMS pressure sensor may be a circuit which inputs an AC signal of a predetermined frequency to the input electrode and monitors a voltage change of the AC signal that is output from the output electrode; and the detection circuit detects a resonance frequency of the vibration as the transmission characteristics of the AC signal when the predetermined AC signal is input to the input electrode while a DC potential is applied between the input and output electrodes, and outputs pressure information as an electrical signal by converting a change of the resonance frequency of the vibrator to a voltage change of the AC signal by a frequency-voltage converting circuit, in which the change of the resonance frequency occurs when the gap changes according to the externally-applied pressure. According to this structure, the change of the resonance frequency according to the pressure is output as the electrical signal.

Embodiments of the present invention will be described in more detail with reference to the accompanying drawings.

In the following description, specific directional or positional terms (for example, "up", "down", "right", "left", or the other terms including any of them) are used. However, these terms are intended to make it easier to understand the present invention with reference to the drawings, and the technical scope of the present invention is not limited by the meaning of these words. The same reference signs in different figures represent the same parts or members.

(First Embodiment)

Figure 1:
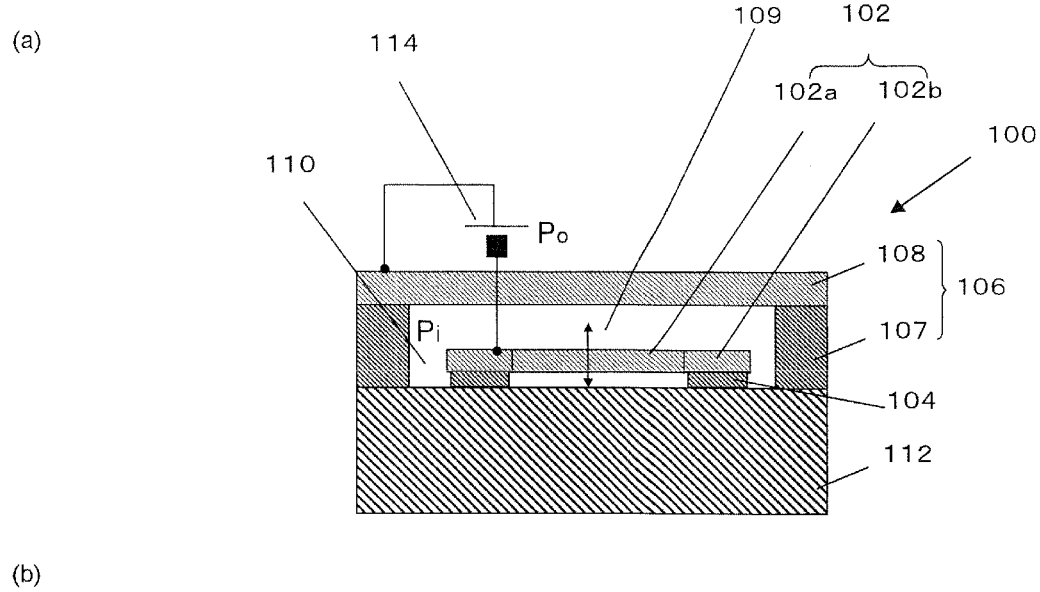
Figure 1:
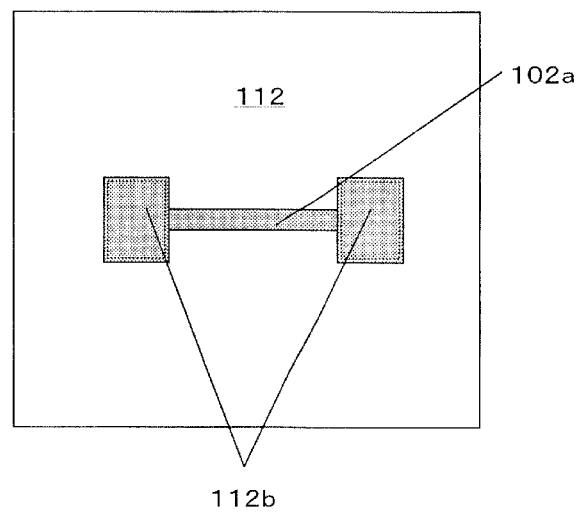

FIG. 1 is a sectional view that describes a MEMS pressure sensor structure according to a first embodiment of the present invention, and showing the state where a DC potential is applied between an vibrator of a MEMS resonator and an electrode that is disposed close to the vibrator. FIG. 1(*a*) is a cross sectional view (taken along a direction perpendicular to the longitudinal direction of the beam of the vibrator), and FIG. 1(*b*) is a top view showing the vibrator 102 formed on a substrate 112 in the state where a shell structure is removed.

In the MEMS resonator 100, the vibrator 102 is a fixed-fixed beam made of a conductive material, and is composed of an vibrating part 102*a* that vibrates mechanically (hereinafter also referred to as an "vibrator vibrating part") and parts 102*b* at both ends of the vibrator at which the vibrator is fixed (hereinafter also referred to as an "vibrator anchor part"). The vibrator anchor parts 102*b* at both ends are fixed on the substrate 112 through insulative support intermediate layers 104. A barrier layer 107 is formed to surround the vibrator 102 on the face of substrate 112 where the vibrator 102 is installed, and a film of diaphragm 108 is formed on the barrier layer 107. The diaphragm 108 and barrier layer 107 form a shell structure 106. The shell structure 106 is composed of the diaphragm 108 and barrier layer 107, and forms a closed space 110 in combination with the substrate 112. The closed shape 110 is provided around the vibrator 102 to allow the vibrator vibrating part 102*a* to perform mechanical vibration. The substrate 112 is, for example, a silicon substrate.

The pressure $P_i$ in the closed space 110 may be equal to the pressure $P_o$ outside the shell structure 106. Alternatively, the closed space 110 may be decompressed to be Pi<Po in order to improve the Q factor of the vibrator. The diaphragm 108 is made of a conductive material or at least one layer of multi-layered laminate of the diaphragm is made of a conductive material, so that a gap 109 between the diaphragm and vibrator has a capacitance.

The vibrator is operated using an vibration mode of the direction of shortening and lengthening the gap, i.e. the direction perpendicular to the surface of the substrate. In the drawing, the double headed arrow shows the vibrating direction of the vibrator 102. When a bias DC voltage is applied on the gap between the diaphragm and vibrator, variance $\Delta f_0/f_0$ of resonance frequency $f_0$ of the vibrator is proportional to the −3rd power of gap size g. This is a phenomenon generally called as "spring softening" of electrostatic transducers. When an external pressure is applied to the diaphragm 108, the diaphragm 108 deforms and the gap 109 changes, and the resonance frequency of the vibrator thus changes. A force applied to the diaphragm, i.e. the pressure, is detected based on the change of the resonance frequency. In the present embodiment, the diaphragm 108 not only functions as an electrode that has a capacitance between it and the vibrator 102, but also displaces according to an external pressure to change the gap 109. In other words, the diaphragm 108, which is the electrode, functions as a pressure transferring mechanism that itself displaces to change the gap 109.

FIG. 2(a) shows a method of detecting pressure. As the diaphragm being an input electrode, a bias DC voltage is applied between the diaphragm 108 and vibrator 102 by a DC power supply 114 that is connected to the diaphragm. As the vibrator 102 being an output electrode, a closed circuit is built so that an AC signal output from the output electrode runs a loop passing through the capacitor formed between the diaphragm and vibrator, an amplifier 204 and a phase regulator 206. Oscillation is generated at the resonance frequency of the vibrator when a gain of the amplifier 204 and a phase shift of the phase regulator 206 are regulated so as to fulfill the oscillation conditions. The oscillation frequency changes according to the external pressure on the diaphragm. The oscillation signal is input to a frequency-voltage converter (F-V converter) 208, and an output signal is thus obtained as a pressure detection signal. That is, in the detection circuit shown in FIG. 2(a), the resonance frequency of the vibrator is detected as the transmission characteristics of the AC signal which runs from the input electrode (in the drawing, diaphragm 108 (or conductive material layer in the case of a multi-layered structure)) to the output electrode (in the drawing, vibrator 102), while the DC potential is applied between the input and output electrodes, and the pressure is detected based on the change of the resonance frequency of the vibrator.

It is also possible to detect pressure without building a loop as shown in FIG. 2(b). A monitor signal source 210 having a certain single frequency $f_{mon}$ is connected to an input electrode (in the drawing, diaphragm 108), the input AC signal is output from an output electrode (in the drawing, vibrator 102) passing through the capacitor formed between the diaphragm 108 and vibrator 102, and an electrical signal is obtained through an amplifier 204 and F-V converter 208. As shown in the drawing, this detection method is based on the principle that when a peak of resonance characteristics shifts along the frequency axis according to pressure, a resonator output signal at the certain frequency $f_{mon}$ shifts its relative position on the slope of a resonance waveform. As shown in FIG. 2(b), for example, the resonance frequency changes from the dotted line to solid line, the intensity level at the frequency $f_{mon}$ is high on the resonance frequency of the solid line while it gets lower on the resonance frequency of the dotted line. It is possible to detect pressure based on such change of the intensity level. In the pressure detection method shown in FIG. 2(b), the F-V converter may be a synchronous detection circuit using the monitor signal source as its reference signal. The detection circuit shown in FIG. 2(b) also detects the resonance frequency of the vibrator as the transmission characteristics of the AC signal from the input electrode to output electrode, and detects pressure based on its change.

According to the MEMS pressure sensor of the present embodiment, even through the vibrator anchor parts are supported by or fixed on the rigid substrate, the pressure applied on the diaphragm is detected without depending on the stress change of the vibrator. Also, in the present embodiment, since the vibrator anchor parts are fixed on and supported by the rigid substrate, the Q factor of the vibrator is prevented from deterioration and pressure can be detected at high resolution.

Figure 2:
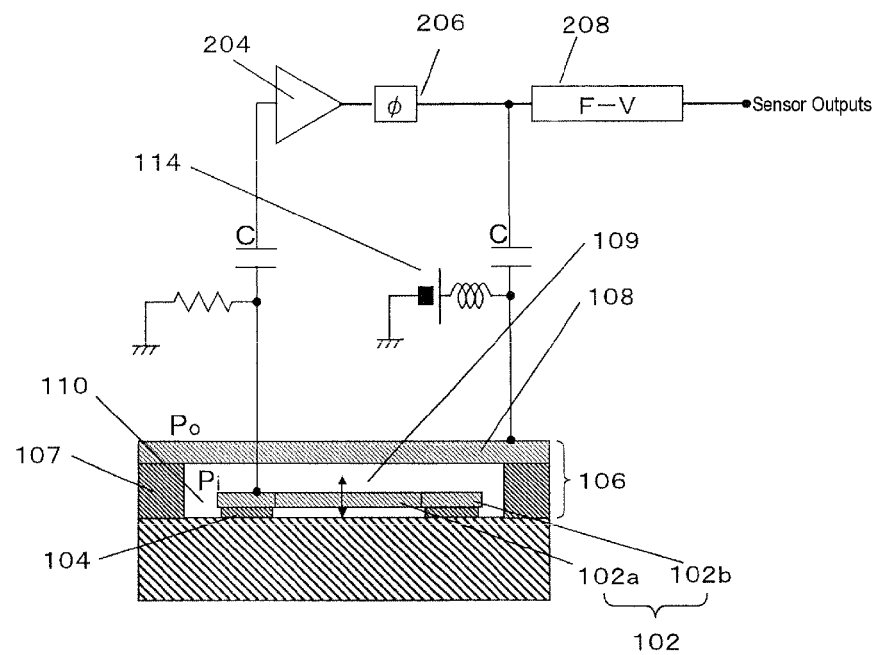
Figure 2:
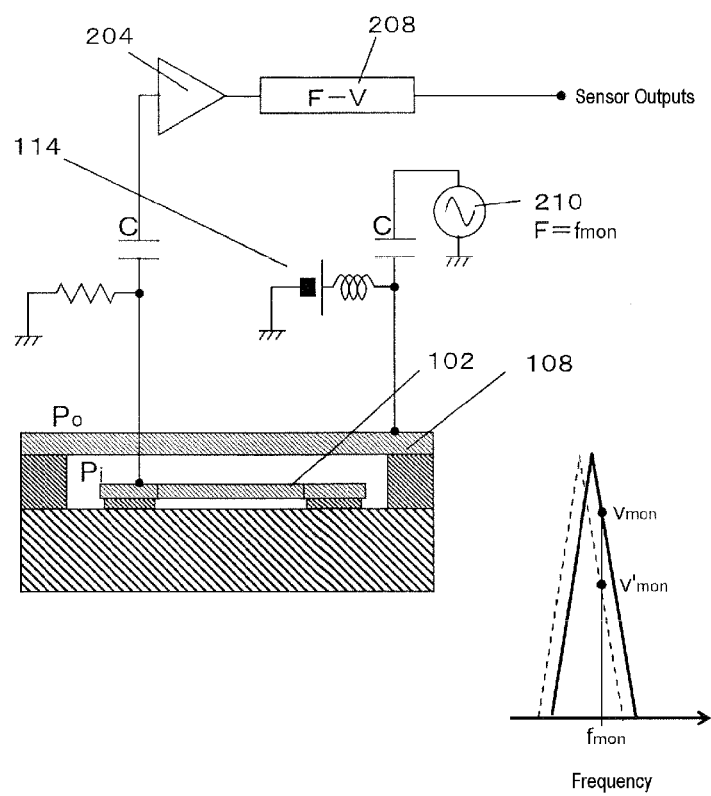

The MEMS pressure sensor of the form shown in FIGS. 1 and 2 may be manufactured by a method of, for example, forming an insulator layer (for example, silicon oxide layer) having a thickness equal to the support intermediate layer 104 onto a substrate 112, forming thereon a conductive layer that is to be an vibrator 102, forming an insulator layer (for example, silicon oxide layer) having a predetermined thickness so that a desired gap is to be formed between the diaphragm 108 and the vibrator 102, forming the diaphragm 108 made of a conductive material onto the insulator layer, and then forming the closed space 110 by etching, which also includes the space under the vibrator vibrating part 102a. If the support intermediate layer 104 and barrier layer 107 are made of the same material in this manufacturing method, the support intermediate layer 104 is also etched partially by the etching as shown in FIG. 3(a). As a result, the size (in the top view) of the support intermediate layer 104 becomes smaller than that of the vibrator anchor part 102b, and the peripheral parts of the vibrator anchor 102b do not have any structure under them and have shape protruding in the horizontal direction (an underetched shape).

If the vibrator anchor parts 102b have such shape, the resonance vibration of the vibrator vibrating part 102a is partially converted to vibration of the peripheral underetched parts of the vibration anchor parts 102b, and it is then dissipated to the substrate 112 through the support intermediate layer 104. Such dissipation deteriorates the Q factor of the vibrator 102. In order to avoid the deterioration of the Q factor, it is desirable that the upsides and lateral sides of the vibration anchor parts 102b are also filled with the barrier layer 107 as shown in FIG. 3(b) so as to avoid the underetched shape.

FIG. 3(b) shows a variation of the present embodiment, a MEMS pressure sensor including a MEMS resonator having no underetched shape. In this variation, the vibrator anchor parts 102b of the vibrator 102 are fixed by the barrier layer 107 that is fixed on the substrate 112. When the vibrator 102 is fixed in this manner, it is also can be regarded that the vibrator 102 is fixed on the substrate 112 through the barrier layer 107. Therefore, this variation also makes it possible to detect pressure applied on the diaphragm 108 at high resolution by measuring the change of the resonance frequency of the vibrator 102, which is caused by the change of the gap 109 arising from the displacement of the diaphragm 108. Also in the variation shown in FIG. 3(b), the barrier layer 107 is formed by two steps. Specifically, an insulator layer, which is to be a lower barrier layer giving a face on which the vibrator 102 is formed, is formed, and a conductive layer, which is to be the vibrator 102, is formed. Then, etching is performed to form the vibrator 102 of a desired shape. Subsequently, an insulator layer, which is to be the upper barrier layer, and the diaphragm 108 are formed on the vibrator 102. Etching is performed to form the closed space 110 and vibrator vibrating part 102a, and the barrier layer 107 that fixes the vibrator 102 is thus formed.

FIG. 3(b) schematically shows the state where a direct power source 114 is connected between the vibrator 102 and diaphragm 108, and applies the bias DC voltage between them. If necessary, a via may be provided in the barrier layer for electrically connecting the vibrator 102 with the direct power source or the other devices.

(Second Embodiment)

Figure 3:
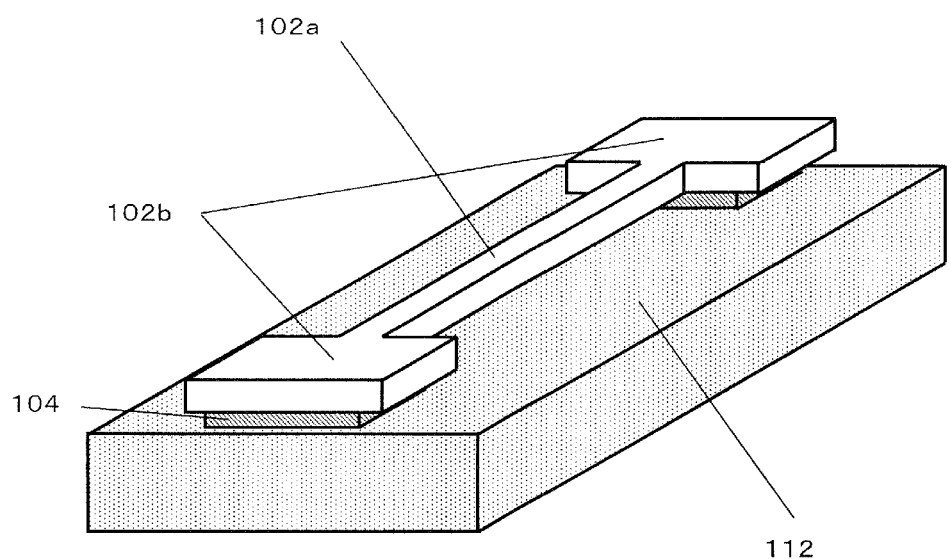
Figure 3:
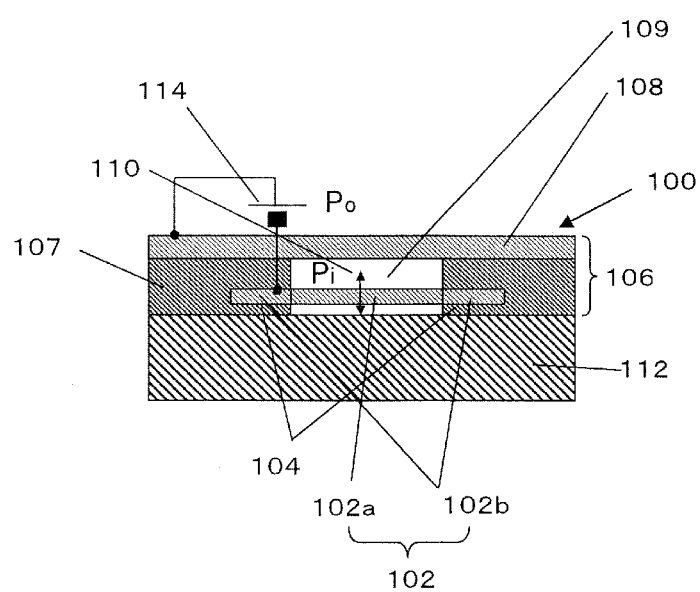
Figure 4:
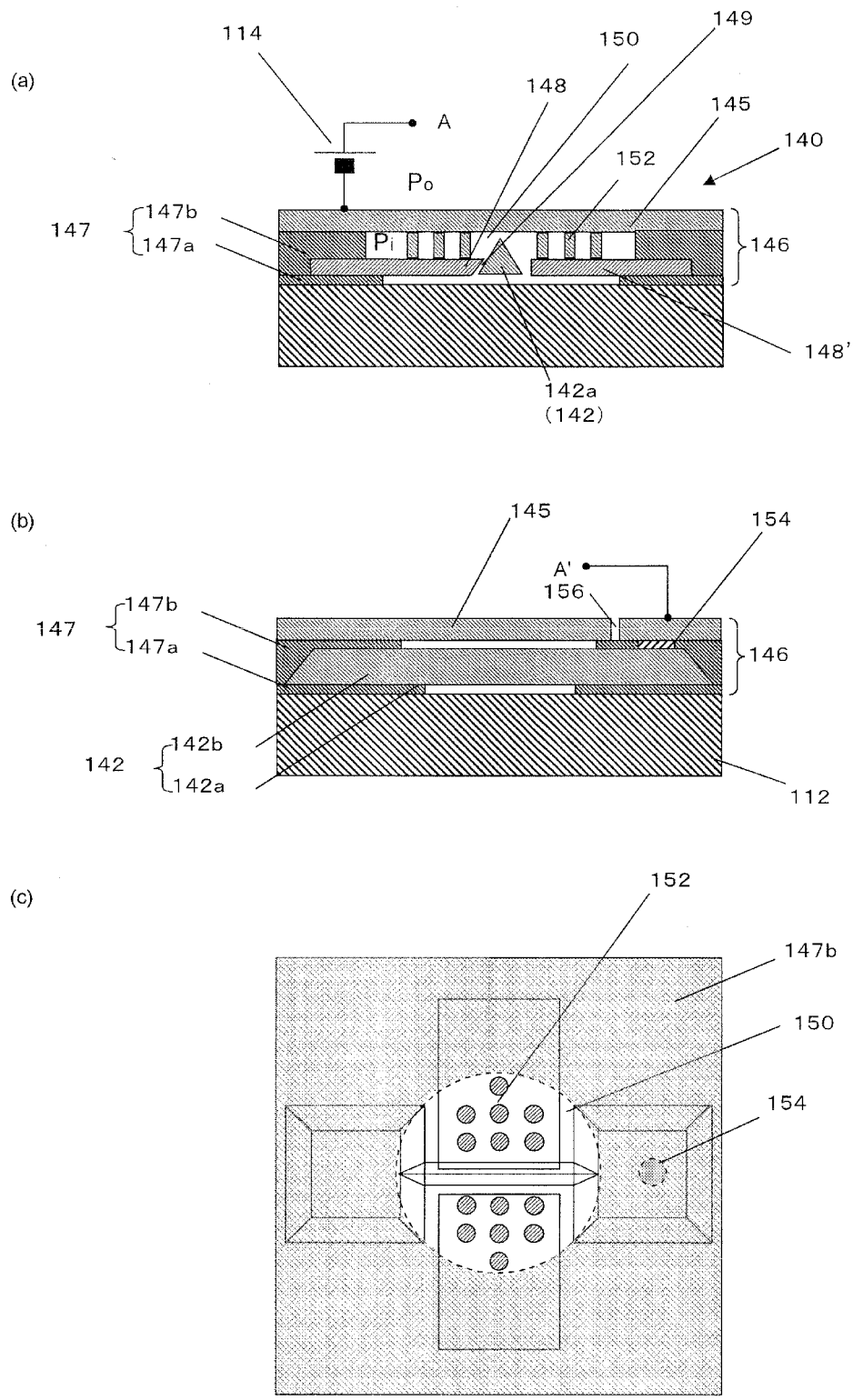

FIG. 4 is a view that describes a MEMS pressure sensor structure of a second embodiment of the present invention, and shows the state where a DC potential is applied between a vibrator of a MEMS resonator and an electrode that is disposed close to the vibrator. FIG. 4(a) is a cross sectional view (taken along a direction perpendicular to the longitudinal direction of the beam of the vibrator), FIG. 4(b) is a sectional view taken along a longitudinal direction of the beam vibrator, and FIG. 4(c) is a top view showing the vibrator and a barrier layer formed on a substrate in the state where a diaphragm is removed. In FIG. 4, the parts or members with the same reference signs as those used in FIGS. 1 to 3 are the same as the parts or members with the respective reference signs in FIGS. 1 to 3, and the description to them may be omitted here.

The vibrator 142 is a beam vibrator that is formed by crystal anisotropic etching of monocrystalline silicon, and a vibrator vibrating part 142a has a triangular or trapezoidal section. The vibrator 142a vibrates torsionally with the center approximately being the center of gravity of the section. A torsional vibration mode gives a higher Q factor than the flexural vibration mode. For example, if the vibrator vibrating part 142a has a length of 100 µm, the flexural and torsional vibration modes give approximately 2 MHz and 20 MHz respectively, and their Q factors are several tens of thousands and 200,000 or more respectively. The torsional vibration mode gives such a higher Q factor mainly because the vibration of the vibrating part 142a leaks less to the vibrator anchor parts 142b in the torsional vibration mode than in the flexural vibration mode, and there is no thermoelastic loss in principle in the torsional vibration mode different from the flexural vibration mode.

Different from the first embodiment, the diaphragm cannot be used as an electrode for excitation or detection of torsional vibration. In a resonator using torsional vibration, an electrode 148 is provided close to a part of the slope of the cross section of the vibrator vibrating part 142a, such that the electrode faces with the vibrator across the gap 149 as shown in FIG. 4(a). In order to convert a displacement of the diaphragm 145 to a change of the gap 149, an additional component is required to transfer the displacement of diaphragm 145 to the electrode 148. Specifically, such component is a connector to connect the diaphragm 145 with the electrode 148.

In FIG. 4(a), a grove of pillars 152 that are made of the same material as the conductive diaphragm 145 are provided as the connector to connect the diaphragm 145 and electrode 148 to each other. In other words, the diaphragm 145 and pillars (connector) 152 function as a pressure transferring mechanism. The displacement of diaphragm 145 is transferred to the electrode 148 by the connectors 152 to displace the electrode 148, and the displacement changes the gap 149. Also in the present embodiment, the change of gap 149 changes the electric field intensity between the vibrator vibrating part 142a and electrode 148, the change of the electric field intensity changes the resonance frequency of the vibrator 142, and pressure is thus detected as the change of the resonance frequency.

The closed space 150 has a circular shape when viewed from the top of the substrate 112 as shown in FIG. 4(c). The diaphragm 145 is subjected to pressure as a disc-shaped diaphragm. The diaphragm 145, pillars 152 and electrode 148 can be nearly regarded as one integral elastic composite. A dummy electrode 148' is provided at the symmetrical position across the vibrator 142 so that the elastic composite has uniform characteristics in the planner direction. In the embodiment shown in the drawing, since the dummy electrode 148' does not have a capacitance between it and the vibrator 142, it does not function as an electrode.

In this embodiment, vibrator anchor parts 142b are fixed by the barrier layer 147 that is provided on both upper and lower faces of them, similarly to the MEMS pressure sensor shown in FIG. 3(b). In more detail, the whole lower faces of the vibrator anchor parts 142b are fixed on the substrate 112 by a lower barrier layer 147a that can be regarded as a support intermediate layer, while the whole upper faces and most part of the side faces of the vibrator anchor parts 142b are covered with an upper barrier layer 147b. This achieves the structure that the vibrator 142 is fixed on the side of substrate 112 without any underetched shape. The barrier layer 147 forms a shell structure 146 in combination with the diaphragm 145, forming a closed space 150.

As shown in the drawing, a through hole is formed by etching a part of the upper barrier layer 147b that locates above the vibrator anchors 142b. The through hole is filled with a conductive material to be a via 154. The via 154 is formed for electrical connection to the vibrator 142. By use of the via 154, a bias DC voltage is applied between the diaphragm 145 and vibrator 142. The voltage is applied by connecting A in FIG. 4(a) with A' in FIG. 4(b).

The MEMS pressure sensor 140 is further provided with a gap 156 that divides the diaphragm 145 into two parts. This is to electrically divide A in FIG. 4(a) (electrical conduction from the electrode 148) and A' in FIG. 4(b) (electrical conduction from the vibrator 142) from each other, if the diaphragm 145 is made of a conductive material.

Figure 10:
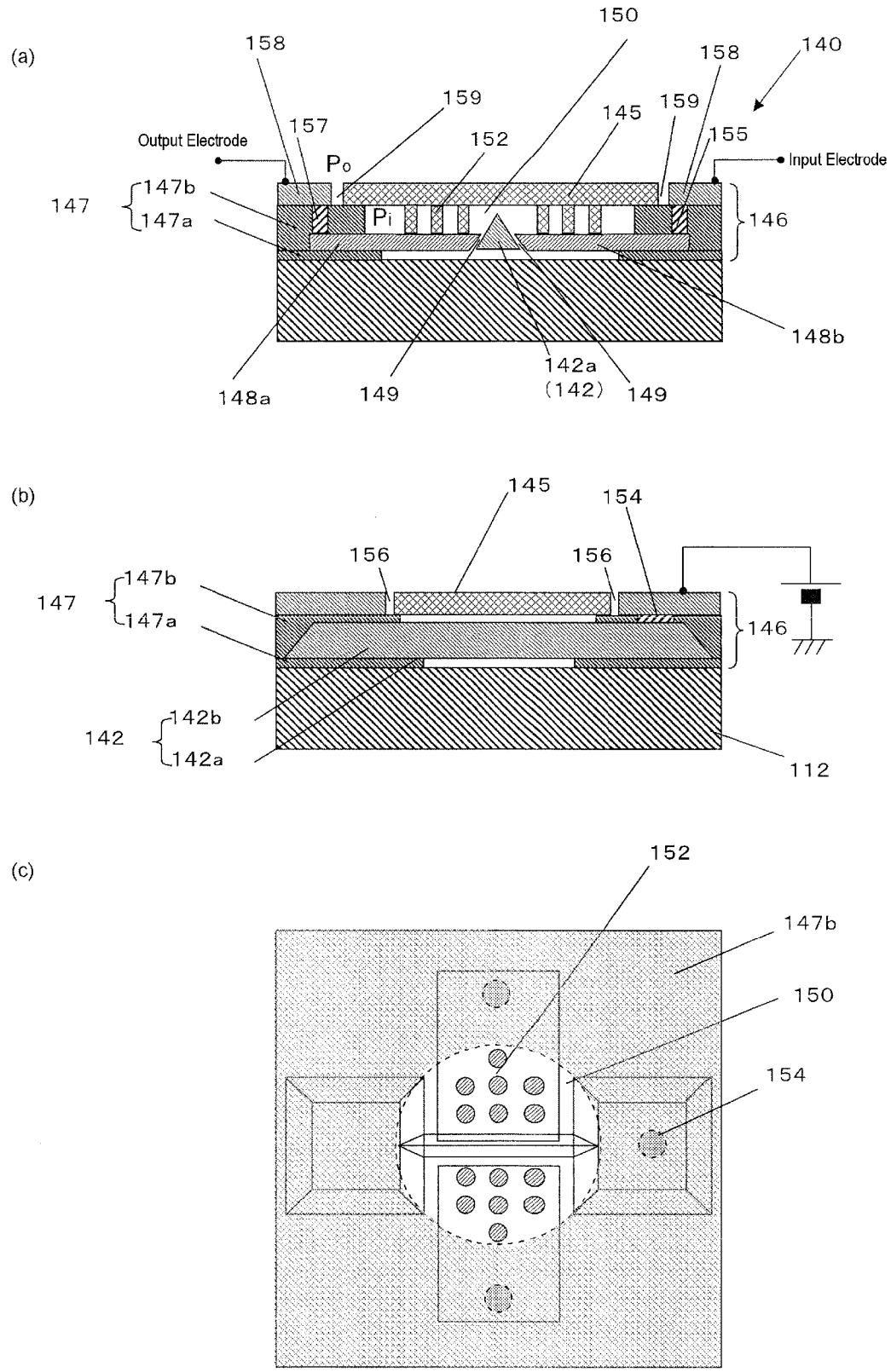

In a variation of the present embodiment, the diaphragm and pillars may be made of an insulative material. In this case, the dummy electrode may be constructed to have a capacitance between it and the vibrator, and thereby may function as an electrode. If the electrode is formed instead of the dummy electrode, a three-terminal circuit may be built by electrically conductions from the two electrodes and the vibrator. FIG. 10 shows an example of such MEMS pressure sensor.

FIG. 10 shows the state where a DC potential is applied between the vibrator of the MEMS resonator and the electrode that is disposed close to the vibrator. FIG. 10(a) is a cross sectional view (taken along a direction perpendicular to the longitudinal direction of the beam of the vibrator), FIG. 10(b) is a sectional view taken along a longitudinal direction of the beam vibrator, and FIG. 10(c) is a top view showing the vibrator and barrier layer formed on the substrate without the diaphragm. In FIG. 10, the parts or members with the same reference signs as those used in FIGS. 1 to 4 are the same as the parts or members in FIGS. 1 to 4 with the respective reference signs, and the description to them may be omitted here.

In FIG. 10, both diaphragm 145 and pillars 152 are made of an insulative material. Two electrodes 148a and 148b are provided close to the parts of two slopes of the cross section of the vibrator vibrating part 142a respectively, such that the electrodes face with the vibrator across the gaps 149. Each of two electrodes 148a and 148b has a capacitance between it and the vibrator vibrating part 142a. A conductive material 158 is disposed around the diaphragm 145. Gaps 156 and 159 are provided in the conductive material 158 to separate electrical conductions from the electrodes 148a and 148b and the electrical conduction from the vibrator 142 from each other.

Through holes are etched in a part of the upper barrier layer 147b that is provided over the electrodes 148a and 148b. The through holes are filled with a conductive material to form vias 155 and 157. The conductive material disposed around the diaphragm and vias can ensure electrical conductions from the two electrodes. The parts of the conductive material 158 where the electrical conductions are led from the vias 155 and 157 are separated from the other part of the conductive material 158 by the gap 159, so that the electrical conductions from two electrodes 148a and 148b are separated one other, and separated from the electrical conduction from the vibrator 142. In the MEMS pressure sensor shown in the drawing, the DC potential is applied between the vibrator 142 and the electrodes 148a and 148b, and the detection circuit detects the transmission characteristics of the AC signal that is entered from the electrode 148b and output from the electrode 148a.

Alternatively, in the MEMS pressure sensor shown in FIG. 10, the vibrator 142 may be the input electrode, and the electrodes 148a and 148b may be the output electrodes. In this case, since the AC signals output from the electrodes 148a and 148b have reversed phases from each other, the transmission characteristics of the AC signal is detected by differential output that outputs difference of the signals output from the two electrodes. Also, it is required in this case that the DC potential is applied so that the electrodes 148a and 148b and vibrator 142 have $-V_p$, $+V_p$ and 0 respectively.

Figure 5:
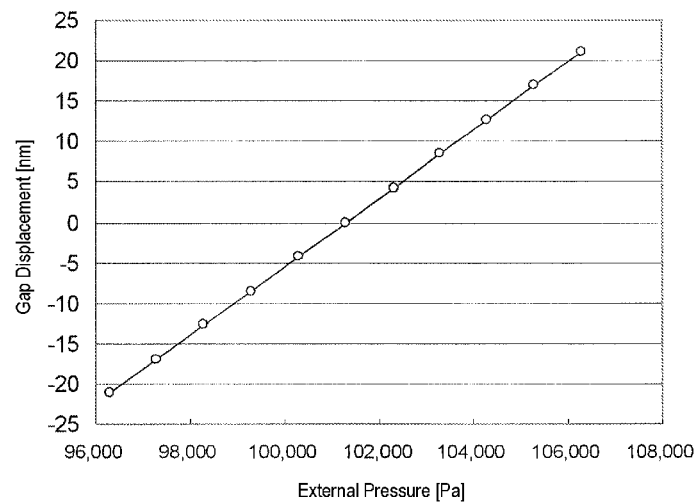
Figure 5:
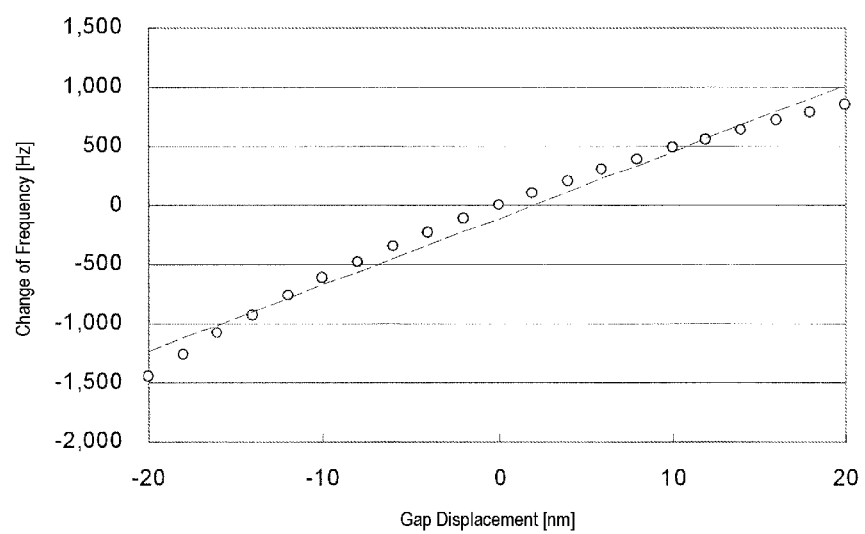

In the MEMS pressure sensor shown in FIG. 4, given that the elastic composite of the diaphragm 145, the pillars 152 and the electrode 148 has a flexural rigidity of $2 \times 10^{-8}$ kg·m, the circular diaphragm 145 has a diameter of 100 µm, and the closed area has a pressure of 10 Pa, and the external pressure $P_0$ changes from normal atmosphere (103,125 Pa) by ±50 hPa (changes between about 960 hPa and about 1,060 hPa), the gap then changes by 20 nm toward the substrate (shown as "−" in the drawing) and 20 nm away the substrate (shown as "+" in the drawing) due to the difference between the inner pressure $P_i$ and outer pressure $P_o$, and thus changes by 40 nm in total, as shown in FIG. 5(a). The gap is 435 nm when there is no difference between the internal pressure $P_i$ and external pressure $P_o$. FIG. 5(b) shows the frequency change of the torsional resonance at 20 MHz that corresponds to the gap change of 40 nm. The frequency change is about 2.4 kHz. The frequency change may be detected by the same method as described in the first embodiment with reference to FIG. 2.

According to the present embodiment, pressure is detected at high resolution by use of the torsional vibration resonator having a high Q factor.

(Third Embodiment)

If the pillars of the transferring mechanism are removed from the MEMS pressure sensor utilizing the second embodiment, the MEMS pressure sensor of the torsional vibration mode can detect a broader range of pressure. In this case, the inner surface of the lower barrier layer is disposed at an outer side than the inner surface of the upper barrier layer, whereby a mechanism of transferring the pressure applied on the diaphragm to the electrode to change the gap, i.e. the pressure transferring mechanism, is formed.

Figure 6:
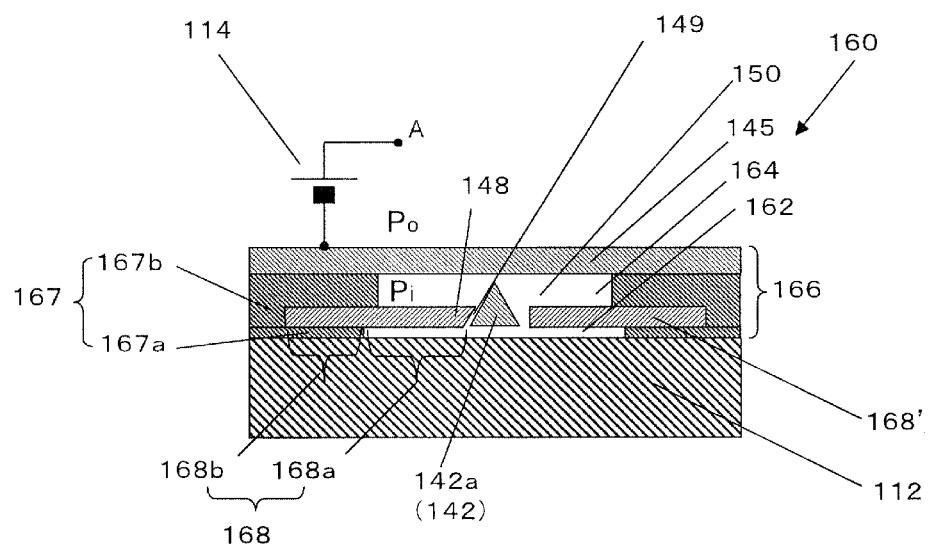
FIG. 6 is a sectional view showing a MEMS pressure sensor structure according to a third embodiment of the present invention.
Figure 7:
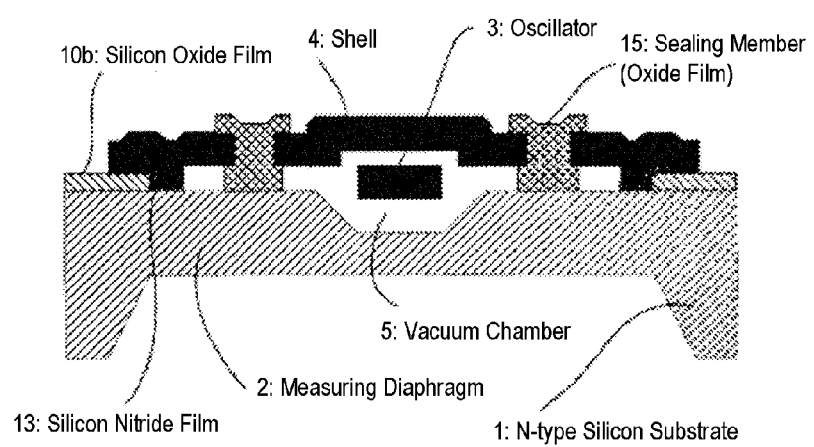
Figure 7:
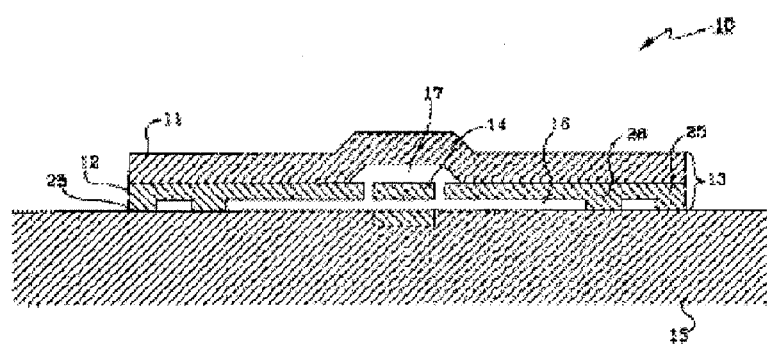

FIG. 6 shows such MEMS pressure sensor. A MEMS resonator 160 of the pressure sensor of FIG. 6 includes an vibrator 142 which vibrates in the torsional vibration mode, an electrode 168, a diaphragm 145 and a substrate 112. First and second cavities 162 and 164 are formed between the substrate 112 and the diaphragm 145, and are separated by an electrode 168 and a dummy electrode 168' from each other. Viewing from the electrode 168 at the area where the vibrator 142 and electrode 168 overlap with each other (in FIG. 6, the electrode that locates parallel to the slope of a triangular vibrator vibrating part 142a), the first cavity 162 locates at the vibrator 142 side in the direction perpendicular to the surface of a substrate 112, and the second cavity 164 locates at the opposite side of the vibrator 142.

In the embodiment shown in the drawing, the side wall that is in contact with the electrode 168 of the first cavity 162, i.e. the inner surface of a lower barrier layer 167a, locates at the outer side in the direction parallel to the surface of the substrate 112 than the side wall that is in contact with the electrode 168 of the second cavity, i.e. the inner surface of an upper barrier layer 167b. The electrode 168 thus has the part that is in contact with the upper barrier layer 167b but not with the lower barrier layer 167a. In the electrode 168, the part that is in contact with both upper and lower barrier layers 167a and 167b is a fixed electrode anchor part 168b, while the part that is only in contact with the upper barrier layer 167b or not with any of the barrier layers is an electrode flexible part 168a that can be bend.

According to this structure, the pressure applied on the diaphragm 145 is transferred to the upper barrier layer 167b, and is further transferred to the electrode 168 at the inner surface of the upper barrier layer 167b (the contact point of the upper barrier layer 167b and electrode 168). Here, since there is a space under the electrode 168, the electrode flexible part 168a bends by force applied thereto downwardly, resulting in change of the gap 149. As mentioned above, according to this structure, the diaphragm 145 and upper and lower barrier layers 167b and 167a function as the pressure transferring mechanism without providing a pillar.

The barrier layer 167 as above may be obtained by sacrifice layer etching in the condition that the lower barrier layer 167a is made of a material that has a smaller etching rate than the material of the upper barrier layer 167b. Alternatively, an etching stop may be provided on the upper barrier layer 167a to make the first cavity 162 larger than the second cavity 164. In the embodiment shown in the drawing, the barrier layer 167 and diaphragm 145 form a shell structure 166 that defines a closed area 150.

INDUSTRIAL APPLICABILITY

The MEMS pressure sensor of the present invention can detect pressure at high resolution by use of the resonance frequency change of the MEMS resonator having a high Q factor. It can be therefore applicable to various fields such as pneumatic sensors, fluid pressure sensors, pressure sense detectors and microphones.

REFERENCE SIGNS LIST 100, 140: MEMS resonator
102, 142: Vibrator
104: Support intermediate layer
106, 146, 166: Shell structure
107, 147, 167: Barrier layer
108, 145: Diaphragm
109, 149: Gap
110, 150: Closed space
112: Substrate
114: DC power source
148, 168: Electrode

148', 168': Dummy electrode
152: Connector (Pillars)
154: Via
204: Amplifier
206: Phase regulator
208: Frequency-voltage converter
210: Monitor signal source

The invention claimed is:

1. A MEMS pressure sensor comprising:
a MEMS resonator comprising:
a substrate;
a vibrator comprising a mechanically vibrating part and a fixed part;
at least one electrode that is disposed close to the vibrator and has an area overlapping with the vibrator across a gap in a direction perpendicular to a surface of the substrate; and
a pressure transferring mechanism to displace the at least one electrode according to externally-applied pressure so as to change the gap; and
a detection circuit to detect transmission characteristics of an AC signal from an input electrode to an output electrode, the input and output electrodes being one and the other of the vibrator and the at least one electrode,
wherein the pressure is detected based on the transmission characteristics of the AC signal that is detected by the detection circuit.

2. The MEMS pressure sensor according to claim 1, wherein the MEMS resonator further comprises a diaphragm that displaces according to externally-applied pressure,
the pressure transferring mechanism is composed of the diaphragm, and
at least part of the diaphragm is formed by the at least one electrode.

3. The MEMS pressure sensor according to claim 1, wherein the MEMS resonator comprises a diaphragm that displaces according to externally-applied pressure, and
the pressure transferring mechanism is composed of the diaphragm and at least one connector that connects the diaphragm with the at least one electrode.

4. The MEMS pressure sensor according to claim 1, wherein the MEMS resonator comprises a diaphragm that displaces by externally-applied pressure,
the vibrator and the at least one electrode are disposed between the diaphragm and the substrate,
a first cavity and a second cavity are formed between the substrate and the diaphragm, the first and second cavities being separated by the at least one electrode,
the first cavity is located at a side of the vibrator in a direction perpendicular to the surface of the substrate when viewed from the at least one electrode at the area where the vibrator and the electrode overlap with each other,
the second cavity is located at an opposite side of the vibrator in a direction perpendicular to the surface of the substrate when viewed from the at least one electrode at the area where the vibrator and the electrode overlap with each other,
an inner surface of a barrier wall A is located at an outer side than an inner surface of a barrier wall B in a direction parallel to the surface of the substrate, the barrier wall A defining the first cavity and being in contact with the electrode, the barrier wall B defining the second cavity and being contact with the electrode, and
the pressure transferring mechanism is composed of the diaphragm, the barrier wall A and the barrier wall B.

5. The MEMS pressure sensor according to claim 1, wherein the fixed part of the vibrator is fixed on the substrate.

6. The MEMS pressure sensor according to claim 5, wherein the fixed part of the vibrator is fixed by a barrier wall that is fixed on the substrate and surrounds a space that allows the vibrator to vibrate mechanically.

7. The MEMS pressure sensor according to claim 1, wherein the vibrator is a beam structure in which the vibrating part of the vibrator is a beam that is provided parallel to the surface of the substrate between the fixed parts of the vibrator,
the beam has a triangular or trapezoidal cross section of which base is parallel to the surface of the substrate, and
the beam vibrates mechanically in a torsional resonance mode with its center being a longitudinal axis of the beam.

8. The MEMS pressure sensor according to claim 1, wherein the detection circuit comprises a feedback circuit with an amplifier along a path,
a signal of the feedback circuit is partially sent to a frequency-voltage converting circuit, and
the detection circuit detects an oscillation frequency of the vibrator as the transmission characteristics of the AC signal by vibrating the vibrator at a predetermined vibration mode while applying a DC potential between the input and output electrodes and outputs pressure information as an electrical signal by converting a change of the oscillation frequency to a voltage change by the frequency-voltage converting circuit, in which the change of the oscillation frequency is caused by a change of a resonance frequency of the vibrator that occurs when the gap changes according to the externally-applied pressure.

9. The MEMS pressure sensor according to claim 1, wherein the detection circuit inputs an AC signal of a predetermined frequency to the input electrode and monitors a voltage change of the AC signal that is output from the output electrode; and
the detection circuit detects a resonance frequency of the vibrator as the transmission characteristics of the AC signal when the predetermined AC signal is input to the input electrode while a DC potential is applied between the input and output electrodes, and outputs pressure information as an electrical signal by converting a change of the resonance frequency of the vibrator to a voltage change of the AC signal by a frequency-voltage converting circuit, in which the change of the resonance frequency occurs when the gap changes according to the externally-applied pressure.

* * * * *

UNITED STATES PATENT AND TRADEMARK OFFICE
CERTIFICATE OF CORRECTION

PATENT NO. : 8,516,905 B2  Page 1 of 1
APPLICATION NO. : 13/583379
DATED : August 27, 2013
INVENTOR(S) : Kunihiko Nakamura et al.

It is certified that error appears in the above-identified patent and that said Letters Patent is hereby corrected as shown below:

On the title page, please add the foreign application priority information (section (30)) as follows:

Item --(30)   Foreign Application Priority Data
April 12, 2011   (JP)   ........................2011-088003--.

Signed and Sealed this
Tenth Day of December, 2013

Margaret A. Focarino
*Commissioner for Patents of the United States Patent and Trademark Office*